United States Patent [19]

Guernet et al.

[11] 4,035,655
[45] July 12, 1977

[54] METHOD AND A DEVICE FOR IMPLANTATION OF PARTICLES INTO A SUBSTRATE

[75] Inventors: Georges Guernet, Meylan; Georges Lefeuvre, Eybens, both of France

[73] Assignee: Commissariat a l'Energie Atomique, Paris, France

[21] Appl. No.: 649,994

[22] Filed: Jan. 19, 1976

[30] Foreign Application Priority Data

Jan. 22, 1975 France .............................. 75.01942

[51] Int. Cl.² .......................................... B05C 11/00
[52] U.S. Cl. ............................ 250/492 A; 313/149; 357/91
[58] Field of Search ....................... 315/111, 111.8; 313/149, 230, 362, 363, DIG. 7; 250/492 A; 357/91; 145/1.5

[56] References Cited

U.S. PATENT DOCUMENTS

| 3,388,009 | 6/1968 | King | 357/91 X |
| 3,689,766 | 9/1972 | Freeman | 250/492 A X |
| 3,778,628 | 12/1973 | Robertson | 250/492 A |

*Primary Examiner*—Eugene La Roche
*Attorney, Agent, or Firm*—McNenny, Pearne, Gordon, Gail, Dickinson & Schiller

[57] ABSTRACT

Implantation of particles and especially ions is carried out by directing a particle beam onto a target and sweeping the beam in two directions at right angles. The target is subjected to a double movement of rotation about two axes which are substantially parallel to the direction of the particle beam. All the points of the target thus describe an epicycloid and are subjected to implantation by the particle beam.

7 Claims, 2 Drawing Figures

METHOD AND A DEVICE FOR IMPLANTATION OF PARTICLES INTO A SUBSTRATE

The present invention relates to a method of implantation of particles into a substrate and especially a method of ion implantation which permits of highly uniform implantation both at the surface and in depth. The invention is also concerned with a device for carrying our said method.

It is known that, in many industrial applications such as the manufacture of integrated circuits and especially in the case of MOS transistor circuits, it is necessary to direct a flux of particles onto a suitable crystalline substrate in order to dope said substrate. The doping agents can be introduced in the form of uncharged particles but are more commonly introduced in the form of ions, this technique being known as ion implantation into a substrate.

In order to ensure reliability and economic performance, methods of ion implantation must permit the achievement of highly homogeneous doping both at the surfaceand in depth. The many industrial designs adopted up to the present time have all been directed towards this objective.

In some methods of implantation, the target sample or substrate is stationary and a system of electrodes brought to periodic potentials is employed in order to deflect the beam of ionized particles in two perpendicular directions X and Y which are substantially parallel to the sample. The ion beam is usually of small size compared with the dimensions of the substrate and the deflection is obtained electrostatically by means of capacitor plates to which are applied, for example, symmetrical triangular voltages. This system suffers from physical limitations: edge effects, non-linearity of applied electrical signals, presence of uncharged particles, which can be minimized but not removed entirely. This system does not make it possible to guarantee homogeneity or, in other words, constancy of concentration of dopant at the surface and in volume cannot be ensured to a higher degree than about 2to 5%.

In a second known method, a particle beam having a fixed direction is employed and the sample is displaced in two directions X, Y. This method is difficult to carry into effect since the mechanical movements in vacuum at constant speed over considerable distances (about 10 centimetres, for example) are very difficult to obtain. Furthermore, the movements of displacement obtained by mechanical means take place at very low speed and cannot result in good homogeneity of the implantation if the intensity of the beam varies to a slight extent. Moreover, the low speed of displacement of the sample entails the need for low particle flux values and impairs the efficiency of the apparatus since the time of utilization is longer than in the first method in respect of an equal quantity of implanted material.

The present invention is directed to a method and a device for implanting a beam of particles into a substrate in such a manner as to overcome the disadvantages mentioned above and arising from inhomogeneity of implantation both at the surface and in volume.

In more precise terms, the method according to the invention consists in subjecting the target at the time of sweeping with a particle beam in two directions X, Y at leastto a double movement of rotation about two axes substantially parallel to the direction of the particle beam and perpendicular to the plane X, Y, with the result that the points of the target describe an epicycloid at the time of implantation.

It has been established that these two means permit the achievement of substantial improvements in homogeneity of implantation since the variations in concentration of implanted particles do not exceed 1%. In accordance with the invention, it is also possible, to set the target (substrate) at a small angle of inclination of a few degrees (0° to 15°) with respect to the direction of the particle beam in order to ensure that said beam impinges upon the sample substrate at an oblique angle of incidence, thereby preventing or minimizing the effects of ion channelling within the crystal when this angle is suitably chosen. This inclination in conjunction with the rotation of the substrate (and with the double rotation) makes it possible to ensure better homogeneity of implantation in depth by obtaining a mean value of channelling effects.

The invention is also concerned with a device for the practical application of the method which will be described hereinafter.

Further characteristic features and advantages of the invention will in fact become more readily apparent from the following description of exemplified embodiments which are given solely by way of explanation and not in any limiting sense, reference being made to the accompanying drawings, in which.

Figure 1:
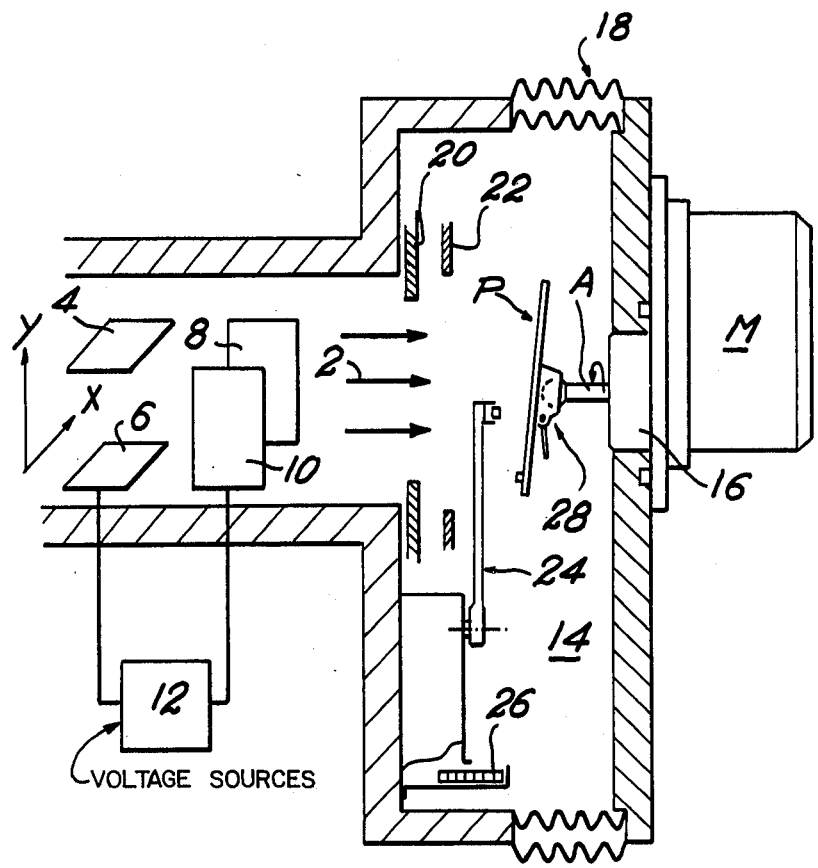
FIG. 1 illustrates an ion implantation device according to the invention, provision being made for a target carrier-plate which can be inclined with respect to an axis of rotation.

There is shown in FIG. 1 one embodiment of the invention in which the particle beam represented schematically by the arrows such as those designated by the reference 2 impinges upon a target carrier-plate P which is inclined with respect to the general direction of the flux of ionized particles. The sweep system XY is represented by the electrodes 4, 6, 8 and 10 (deflecting electrodes) which permit sweeping along two axes X, Y by means of two supply-voltage sources (relative in one case to the direction X and in the other case to the direction Y) for delivering, for example, symmetrical triangular voltages having a judiciously chosen frequency ratio. A conventional voltage source 12 provides power to the electrodes 4, 6, 8 and 10.

The complete assembly is placed within a vacuum chamber 14. The motor M drives a shaft A which penetrates into the chamber 14 through a vacuum-tight passage 16. The bellows seal 18 endows the apparatus with a certain degree of elasticity and facilitates disassembly of this latter. The ion beam is stopped-down by the diaphragm 20 and provision is also made for an electron trap 22 for removing the secondary electrons emitted during the bombardment. The mechanical arm 24 serves to extract samples from the magazine 26 in order to place and fix these latter on the carrier-plate P by means of a small sample-holding magnet. In this embodiment, the carrier-plate P can be inclined by means of a pivot 28 which serves to orient said carrier-plate P at an angle which is adjustable with respect to the shaft A.

In order to carry out the ion implantation operation, a sample is taken from the magazine 26 by means of the arm 24 and placed on the carrier-plate P which has been set at a predetermined angle of inclination. The motor M is then started-up so as to drive the shaft A and consequently the carrier-plate P in rotation, said shaft A being in turn rotationally coupled to a second shaft which is not shown in this figure but in FIG. 2. The ion beam produced by a source (not shown) is then formed and swept by the device comprising the deflecting electrodes which are supplied by the two voltage sources.

The inclination of the sample with respect to the incident particle flux in conjunction with the rotation of the sample about its own axis serves to overcome inhomogeneities in depth of penetration of the particles within the crystalline target. The variations usually observed in the shape of the concentration profiles are due to variations in beam entrance angle with respect to the sample during irradiation (incident beam normal to the target at the center of this latter and divergent near its periphery).

A preliminary calibration which employs the method of back-scattering of charged particles in a substrate as a function of the angle of orientation makes it possible to determine the angle at which the number of back-scattered particles is of maximum value, that is, the angle at which particle channelling effects are limited to a minimum. In the case of a silicon substrate, the angle of 7° ± 1° is particularly favorable and results in very strong back-scattering of α-particles or protons, thus promoting homogeneity of implantation in depth at a value of approximately 10%. The fact of associating the rotation of the sample about its own axis with the angle aforementioned tends to produce a mean value of residual channelling effects and makes it possible to attain a homogeneity of the order of 1%.

Figure 2:
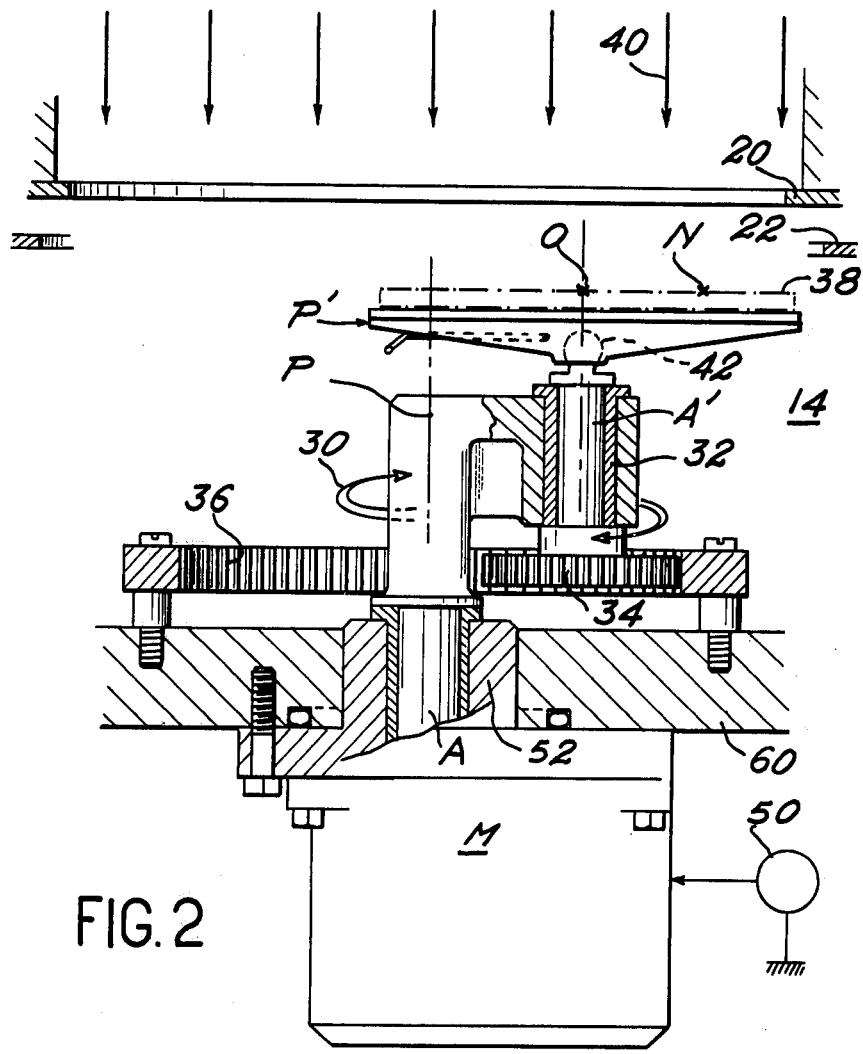
FIG. 2 illustrates an implantation device according to the invention in which a system comprising a double carrier-plate causes each point of the target to describe an epicycloid.

There is shown in FIG. 2 one embodiment of the device according to the invention in which a system comprising a double carrier-plate causes each point of the sample to describe an epicycloid.

Said device comprises a motor M coupled to a shaft A which rotates in the direction indicated by the arrow 30. Said shaft A couples the external motor M to the vacuum chamber 14 and is provided with an extension in the form of a carrier-plate P. A guide bush 32 is fitted in said carrier-plate and a shaft A' which is the shaft of the toothed wheel 34 is rotatably mounted in said guide bush. Said toothed wheel 34 is disposed in meshing engagement with a circular toothed rack 36 which is coaxial with the shaft A. The shaft A' which is secured to the sample carrier-plate P' rotates within the carrier-plate P which is driven in rotation by the shaft A by means of the system comprising the toothed wheel 34 and pinion 36. The target 38 is subjected to the ion implantation produced by the ion beam 40 which undergoes a double sweep by means of a deflecting system of similar design to that shown in FIG. 1 but omitted from FIG. 2. The device further comprises the diaphragm 20 and the electron trap 22.

In this alternative embodiment of the invention, each point of the substrate such as N describes an epicycloid except for the central point 0 which describes a circle. As in FIG. 1, a mechanical arm (not shown in FIG. 2) serves to place samples 38 on the carrier-plate P'. Said carrier-plate can be oriented in the particle flux by means of a pivot 42.

Another alternative embodiment which has been designed and developed consists in maintaining the carrier-plate P' at right angles to its axis of rotation A'.

In consequence, the complete mechanical system is oriented with respect to the incident beam 40 by means of the end-plate 60 which is set at an angle of a few degrees (7° in the case mentioned earlier) with respect to the initial direction shown in FIG. 2. The device further comprises a unit 50 for measuring the current received by the target; this current can be measured by means of the current which flows through the shaft A since the passages such as those designated by the reference 52 are formed of insulating material. By way of example, the passage 52 is of Teflon and the speed of rotation of the shaft A is approximately 10 revolutions per minute. By means of an electric supply not shown in the figure, the electron trap 22 is brought to a negative potential of a few hundred volts. The vacuum created within the chamber 14 has a value of about $10^{-7}$ torr. A measurement carried out on an implanted sample having a diameter of about 10 centimeters has served to establish that homogeneity of the bombardment was of the order of 1%, which gives clear evidence of a marked technical improvement.

What we claim is :

1. A method of implantation and especially ion implantation in which a beam of particles and especially an ion beam is directed onto a target in order to carry out an ion implantation into said target, said beam of particles being swept in two perpendicular directions, wherein said target is subjected to a double movement of rotation about two axes substantially parallel to the direction of the particle beam so that all the points of the target describe an epicycloid and are subjected to implantation by said particle beam.

2. A method according to claim 1, wherein the target is set at a predetermined angle of inclination with respect to the direction of the particle beam.

3. A method according to claim 2, wherein said angle is within the range of 0° to 15°.

4. A device for ion implantation in a vacuum for the practical application of the method according to claim 1, wherein said device comprises:

a motor M for driving a shaft which extends through a vacuum-tight passage and couples said motor a carrier-plate P located within a vacuum chamber, means for deflecting a particle beam in two directions substantially perpendicular to the shaft, a circular toothed rack rigidly fixed to the vacuum chamber and coaxial with the chamber A, a toothed wheel being disposed in meshing engagement with said toothed rack, a second shaft A' which is the shaft of the toothed wheel and passes through the carrier-plate P within a guide bush, said second shaft being adapted to support a carrier-plate P' on which the target-samples are placed.

5. A device according to claim 4, wherein the target-sample carrier-plate and its rotary shaft are rigidly fixed and orientable with respect to the incident beam.

6. A device according to claim 4 wherein said device comprises a mechanical arm for successively extracting the target-samples from a magazine in order to place said samples on said carrier-plate and for replacing said targets in the magazine after implantation.

7. A device according to claim 6, wherein said target samples are rigidly fixed to a sample-carrier provided with a magnet and wherein said carrier-plate is of ferromagnetic material.

* * * * *

UNITED STATES PATENT OFFICE
CERTIFICATE OF CORRECTION

Patent No. 4,035,655          Dated   July 12, 1977

Inventor(s)   Georges Guernet et al.

It is certified that error appears in the above-identified patent and that said Letters Patent are hereby corrected as shown below:

Column 1, line 42, delete "2to" and insert -- 2 to --.

Column 1, line 66, delete "leastto" and insert -- least to --.

Claim 4, column 4, line 42, after "motor", insert -- to --.

Signed and Sealed this

Fourth Day of October 1977

[SEAL]

Attest:

RUTH C. MASON
*Attesting Officer*

LUTRELLE F. PARKER
*Acting Commissioner of Patents and Trademarks*